United States Patent

Eng et al.

[11] Patent Number: 5,952,611
[45] Date of Patent: Sep. 14, 1999

[54] FLEXIBLE PIN LOCATION INTEGRATED CIRCUIT PACKAGE

[75] Inventors: Kian Teng Eng; Min Yu Chan; Jing Sua Goh; Siu Waf Low, all of Singapore, Singapore

[73] Assignee: Texas Instruments Incorporated, Dallas, Tex.

[21] Appl. No.: 08/994,723

[22] Filed: Dec. 19, 1997

[51] Int. Cl.$^6$ ................................. H01L 23/02
[52] U.S. Cl. ................ 174/52.4; 257/691; 257/738; 257/693
[58] Field of Search ............... 174/52.4, 52.2; 257/691, 692, 693, 587, 582, 730, 738; 361/775

[56] References Cited

U.S. PATENT DOCUMENTS

| | | | |
|---|---|---|---|
| 3,179,913 | 4/1965 | Mittler et al. ........................ | 439/48 |
| 3,370,203 | 2/1968 | Kravitz et al. ...................... | 361/730 |
| 3,459,998 | 8/1969 | Focarile ............................. | 361/690 |
| 3,904,934 | 9/1975 | Martin ............................... | 361/803 |
| 4,288,841 | 9/1981 | Gogal ............................... | 361/792 |
| 4,502,098 | 2/1985 | Brown ............................... | 361/690 |
| 4,574,331 | 3/1986 | Smolley ............................. | 361/735 |
| 4,646,128 | 2/1987 | Carson et al. ..................... | 257/777 |
| 4,691,225 | 9/1987 | Murakami et al. ................. | 257/693 |
| 4,727,410 | 2/1988 | Higgins, III ....................... | 257/700 |
| 4,823,233 | 4/1989 | Brown et al. ...................... | 361/692 |
| 4,833,568 | 5/1989 | Berhold ............................. | 361/690 |
| 4,862,248 | 8/1989 | Carlson ............................. | 257/668 |
| 4,868,712 | 9/1989 | Woodman .......................... | 361/689 |
| 4,953,005 | 8/1990 | Carlson et al. .................... | 257/666 |
| 5,016,138 | 5/1991 | Woodman .......................... | 361/688 |
| 5,019,945 | 5/1991 | Smolley ............................. | 361/803 |
| 5,172,303 | 12/1992 | Bernardoni et al. ............... | 361/744 |
| 5,345,038 | 9/1994 | Miyauchi et al. .................. | 174/52.4 |

Primary Examiner—Kristine Kincaid
Assistant Examiner—Hung V Ngo
Attorney, Agent, or Firm—Mark A. Valetti; Carlton H. Hoel; Richard L. Donaldson

[57] ABSTRACT

An integrated circuit package (30) including a substrate (70) having an opening (86) and first and second surfaces (92, 94), a plurality of pads (100) disposed on the first and second surfaces (92, 94) having disposed thereon solder balls (150) electrically connected by a via (84) that provides the end-user with flexibility in the location of a power supply Pin (96) is disclosed.

19 Claims, 3 Drawing Sheets

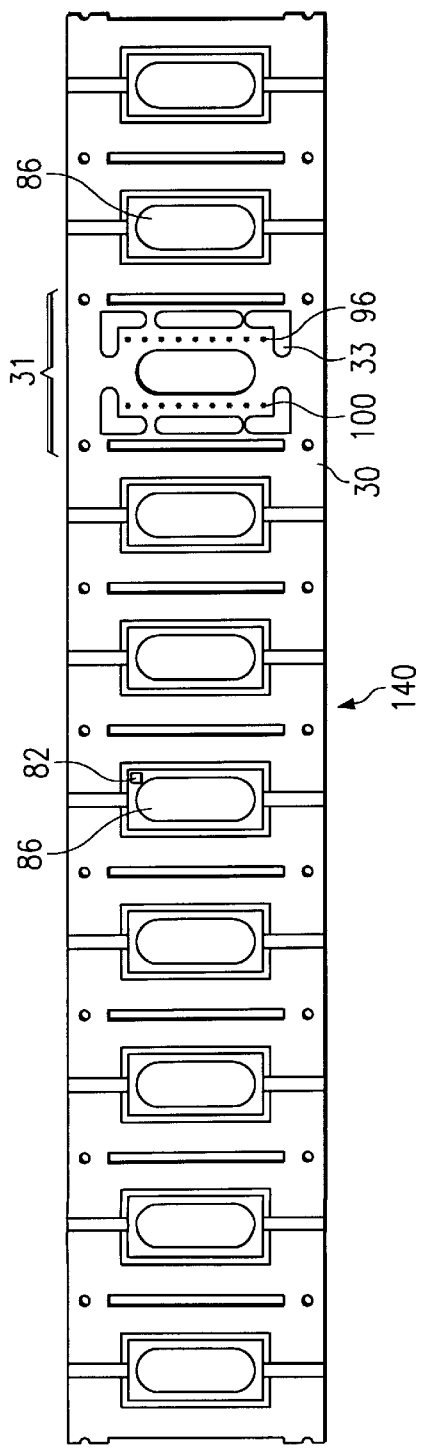

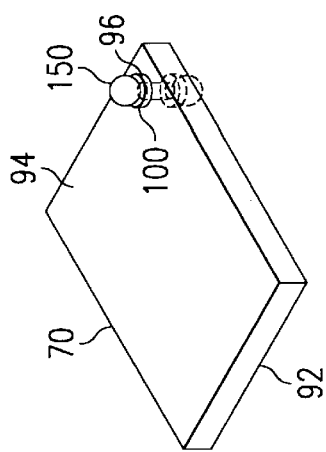
FIG. 6B
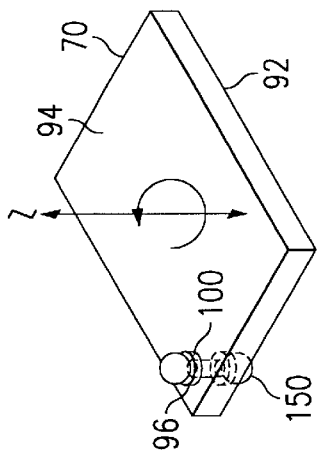
FIG. 6E
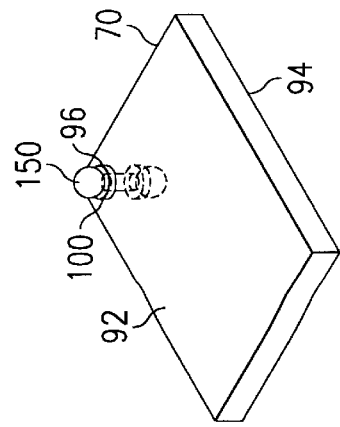
FIG. 6A
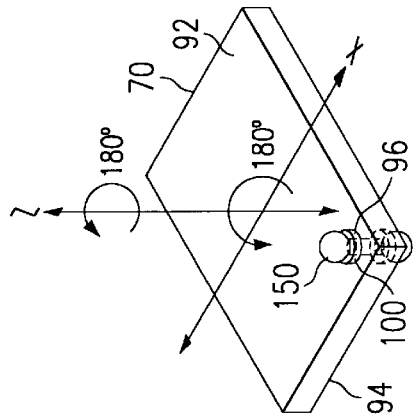
FIG. 6D
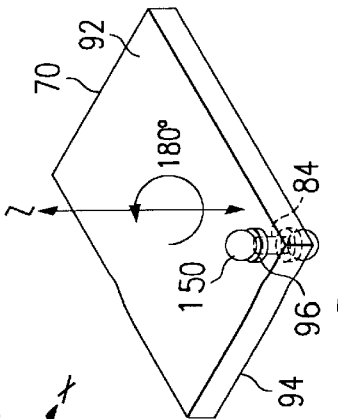
FIG. 6C
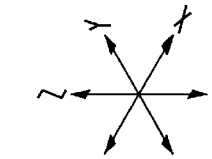

FLEXIBLE PIN LOCATION INTEGRATED CIRCUIT PACKAGE

TECHNICAL FIELD OF THE INVENTION

The present invention relates in general to the field of integrated circuit packages and more specifically to substantially flat, double sided integrated circuit packages that provide a flexible location for the power connections of the integrated circuit.

BACKGROUND OF THE INVENTION

Without limiting the scope of the invention, its background is described in connection with integrated circuit packages, as an example.

Heretofore, in this field, integrated circuits have been formed on semiconductor wafers. The wafers are separated into individual chips and the individual chips are then handled and packaged. The packaging process is one of the most critical steps in the integrated circuit fabrication process, both from the point of view of cost and of reliability. Specifically, the packaging cost can easily exceed the cost of the integrated circuit chip and the majority of device failures are packaging related.

The integrated circuit must be packaged in a suitable media that will protect it in subsequent manufacturing steps and from the environment of its intended application. Wire bonding and encapsulation are the two main steps in the packaging process. Wire bonding connects the leads from the chip to the terminals of the package. The terminals allow the integrated circuit package to be connected to other components. Following wire bonding, encapsulation is employed to seal the surfaces from moisture and contamination and to protect the wire bonding and other components from corrosion and mechanical shock.

Conventionally, the packaging of integrated circuits has involved attaching an individual chip to a lead frame, where, following wire bonding and encapsulation, designated parts of the lead frame become the terminals of the package. The packaging of integrated circuits has also involved the placement of chips on a flexible board where, following adhesion of the chip to the surface of the flexible board and wire bonding, an encapsulant is placed over the chip and the adjacent flexible board to seal and protect the chip and other components.

Unfortunately, current methods for encapsulating silicon chips have led to various problems, including cracking between the encapsulation material and the integrated circuit components, as well as high failure rates due to the multistep nature of the process. Cracking has plagued the industry because of differences in the coefficient of thermal expansion of the different components, for example, between the soldering materials at the different interfaces and between metallic and non-metallic components. Cracking is also frequent between the silicon wafer and the encapsulation materials, usually epoxies, due to the extreme variations in temperature in various environments and between periods of operation and non-operation.

Furthermore, even if the integrated circuit is successfully assembled, current encapsulation technologies limit the design options available for the designer of, for example, motherboards. The designer of motherboards is forced to use the lead configuration designed into the integrated chip module, in particular the position of Pin #1, which often provides the $V_{cc}$ or ground for the integrated circuit.

Therefore, a need has arisen for an integrated circuit package and a process for producing an integrated circuit package that provides for flexibility in the location of connection leads. More particularly, a need has arisen for an integrated circuit that provides the designer of motherboards flexibility in the routing of current or ground to the integrated circuit. As integrated circuits become increasingly miniaturized, a need has also arisen for shorter circuit routing on motherboards because of the constraints on the thickness of layers, current, and resistance.

SUMMARY OF THE INVENTION

The present invention disclosed herein comprises an integrated circuit package and a process for producing an integrated circuit package that provides flexibility in the orientation of the integrated circuit package. More particularly it provides a flexible location for Pin #1, which generally provides a source of $V_{cc}$ or ground for the integrated circuit.

The integrated circuit package comprises a substrate having an opening and first and second surfaces. At least one bus bar is integral with the substrate and extends into the opening. A power terminal having first and second ends is disposed within the substrate. The first end disposed on the first surface and the second end is disposed on the second surface. The first and second ends are electrically connected with the bus bar. A via extends between said first and second ends.

A plurality of routing strips are integral with the substrate and extend into the opening. A plurality of pads is disposed on the first and second surfaces. At least one of the pads disposed on the first surface is electrically connected with at least one of the routing strips and at least one of the pads disposed on the second surface is electrically connected with at least one of the routing strips.

A chip is adhered to the substrate. The chip includes at least one bonding pad. Wire bonding electrically connects the bonding pad to at least one of the routing strips. Wire bonding electrically connects the bus bar to at least one of the bonding pads. Potting material fills the opening.

In one embodiment of the present invention, at least one solder ball is located on the first end of the power terminal. In another embodiment of the present invention, at least one solder ball is located on the second end of the power terminal. In yet another embodiment, at least one solder ball located on the end of the power terminal and at least one solder ball located on the second end of the power terminal.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 4 is a simplified view of a printed circuit board substrate strip showing 10 units;

FIG. 5 is a simplified view of an integrated circuit package comparing the position of Pin #1 in top and bottom views of an integrated circuit package; and FIG. 6 is a three dimensional rotational progression showing the different positions for the location of Pin #1.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention is related to a high frequency integrated circuit that provides flexibility in the orientation of the integrated circuit, and more particularly, to the position of Pin #1. The present invention is also related to a board-on-chip design to enable a plurality of integrated circuit packages to be stacked together for high speed performance and to meet the space constraint requirements of modern semiconductors. The present invention also addresses the problems associated with the electronic capacity of the chip assembly, and in particular to the limits created by standard integrated circuit encapsulation. The principles of the present invention may be incorporated into, for example, a synchronous DRAM (SDRAM) silicon chip. However, the present invention is also applicable to LOGIC, SRAM, EPROM and any other integrated circuit components.

Figure 1:
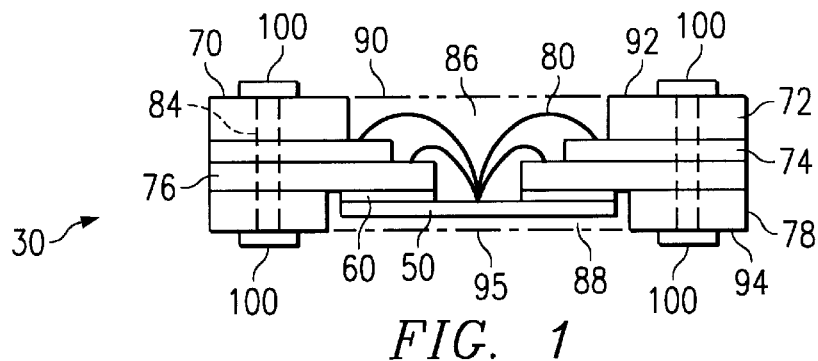
FIG. 1 is a simplified end cross-sectional view of an integrated circuit package of the present invention.

FIG. 1 is a simplified cross-sectional view of an integrated circuit package that is generally designated 30. The integrated circuit package 30 comprises a silicon chip 50, which can be, for example, any integrated circuit component such as a DRAM, an EPROM, a SRAM or a LOGIC chip. A printed circuit board 70 is attached to the silicon chip 50 by an adhesive layer 60. The adhesive layer 60 may be made of, for example, a double-sided adhesive polyamide tape, adhesive glue or epoxy. The printed circuit board 70 consists of four layers, a top layer 72, an intermediate layer 74, an intermediate layer 76, and a bottom layer 78.

The printed circuit board 70 may be constructed from a material such as FR-4 which is available from, for example, Motorola Inc., U.S.A. FR-4 is an epoxy resin reinforced with a woven glass cloth. In selecting the material for printed circuit board 70, one skilled in the art will recognize that four parameters should be considered namely, thickness, dielectric constant, glass transition temperature and the coefficient of thermal expansion.

Thickness is dependant on the number of layers required and the amount of reinforcement used in a given layer. The reinforcing glass cloth can range in thickness from 2 mil per sheet (type 106) to about 8 mil per sheet (type 7628). Dielectric constant is determined by a combination of the resin used and the thickness and type of reinforcement used. Standard FR-4 has a dielectric constant of about 4.5. This constant can be reduced to about 3 by replacing the epoxy resin with a cyanate ester resin. The greater the thickness, however, the greater the problems associated with thickness control, rough surfaces, excessive drill reflection and poor resin refill.

The temperature at which a resin changes from a glass-like state into a "rubbery" state is generally designated as $T_g$. Standard FR-4 is made with a bifunctionally polymerizing epoxy that has a $T_g$ of about 110° C. Higher $T_g$ temperatures, such as 125–150° C. may be withstood by using a tetrafunctional epoxy. For higher $T_g$ values, in the range of 150 to 200° C. a cyanate ester:epoxy blend can be used. Additionally, polyimides provide for printed circuit boards having a $T_g$ above 250° C.

The coefficient of thermal expansion for FR-4 is about 16 ppm/° C. A difference in the coefficient of thermal expansion between the printed circuit board 70 made from FR-4 and the silicon chip 50 can lead to failure of the integrated circuit package 30 during, not only the assembly of the integrated circuit package 30, but also during the use of integrated circuit package 30.

The adhesive layer 60 may be Hitachi HM122u. Alternatively, the silicon chip 50 can be adhered to the printed circuit board 70 with a die bonding film such as HIATTACH-335 (DF-335) manufactured by Hitachi Chemical Company of Tokyo, Japan. HIATTACH-335 (DF-335) is silver filled thermosetting type resin film for die-attaching. The bonding process generally involves attaching the film on the printed circuit board 70 at 160° C. for 5 seconds with an applied force of 1000–3000 grams; then attaching the silicon chip 50 on the film at 220° C. for 5 seconds under a force of 150–200 grams.

DF-335 has the following properties

| Test | Remarks | Units | DF-335 |
|---|---|---|---|
| Appearance | Visual | — | silver film |
| Solid Content | 200° C. - 2 h | wt % | ≧96 |
| Ash Content | 600° C. - 1.5 h | wt % | 40 |
| Ash Content/ Solid | 600° C. - 1.5 h | wt %/solid | 42 |
| Thickness | Dial gauge | μm | 25 |
| Tensile Strength | R. T. | kgf/mm$^2$ | 7.1 |
| Tensile Modulus | R. T. | kgf/mm$^2$ | 271 |
| Die shear strength | 4 × 4 mm chip/Ag plated alloy 42 | kgf/chip | |
| R. T. | | | ≧10 |
| 250° C. | | | 0.9 |
| Peel strength 240° C. (after/ 85° C. 85%, 48h) | 8 × 8 mm chip/bare alloy 42 | kgf/chip | ≧3.0 |
| Tg | TMA, 180° C. - 1h cured | ° C. | 123 |
| Modulus | Viscoelastic spectrometer | Mpa | 1300 |
| Moisture | 85° C./85% RH, 48 h | wt % | 0.1 |

Other examples of adhesives include thermosetting adhesives, such as epoxies, polyimides and silicone. Thermoplastic adhesives that are hot-melted, in the form of sheets or as a pressure sensitive adhesive tape may also be used to adhere silicon chip 50 to the printed circuit board 70. Commonly used are adhesive tapes based on elastomers, silicones or acrylics because of their ease of use and easy incorporation into production.

Figure 2:
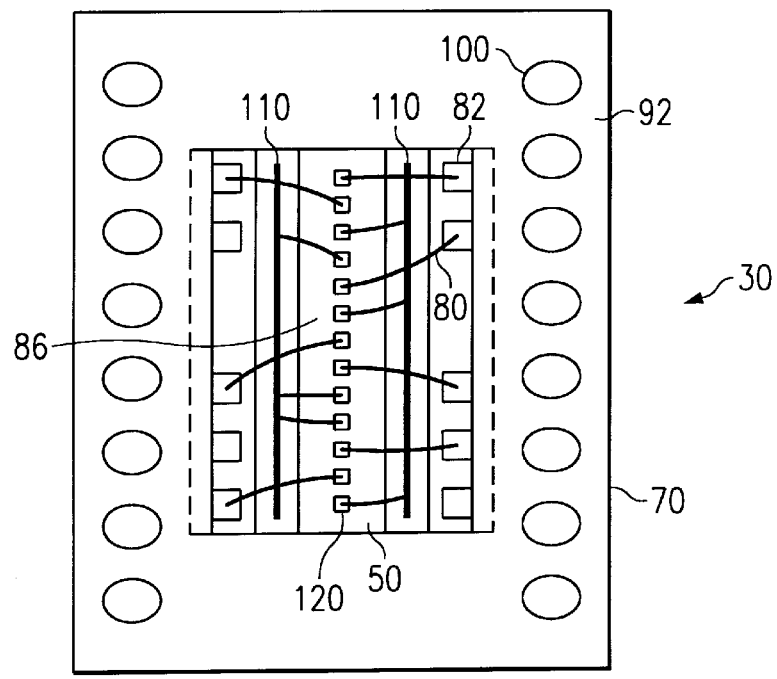
FIG. 2 is a simplified top view of an integrated circuit package of the present invention.

Referring collectively to FIGS. 1 and 2, intermediate layer 74 has routing strips 82 that are electrically connected through vias 84 to pads 100 located on top surface 92 of top of top layer 72 and bottom surface 94 of bottom layer 78. It should be understood by one skilled in the art that the terms "top" and "bottom" as well as the terms "side" and "end" are used for illustration purposes only, as the integrated circuit package 30 of the present invention can be assembled and used in a variety of positions and ways. Intermediate layer 76 includes a pair of bus bars 110. The bus bars are electrically connected through vias 84 to one or more of the pads 100. The bus bars 110 may serve, for example, as power supplies or grounds, and it is preferred that one bus bar 110 serve one function, such as a power supply, and the second bus bar 110 serve another function, such as a ground.

The silicon chip 50 has bonding pads 120 located generally in the central area of silicon chip 50. The bonding pads 120 are connected to routing strips 82 and bus bars 110 by wire bonding 80.

Even though FIG. 1 depicts printed circuit board 70 as having four layers 72, 74, 76 and 78, it should be understood by one skilled in the art that printed circuit board 70 may consist of a single layer or may be a multi-layered board having an alternate number of layers.

The above described components and their constructions and interrelation provide an assembly that is encapsulated as described below. The term "assembly" refers to the assembled components prior to encapsulation. The assembly consists of printed circuit board 70, adhered silicon chip 50 and wire bonding 80. The printed circuit board 70 has a top opening 86 and a cavity 88 with routing strips 82 and bus bars 110 extending into the top opening 86. The top opening 86 and the cavity 88 are open with respect to one another.

The wire bonding 80 process may begin after silicon chip 50 has been adhered to printed circuit board 70. Silicon chip 50 and printed circuit board 70 are then positioned on a heated pedestal to raise the temperature of the combination to a point between 100°–300° C. A gold wire having a diameter typically ranging from 0.7 mil. to 1.3 mil. is strung through a heated capillary where the temperature may range between 200°–500° C. A soldering ball is created at the end of the wire using either a flame or a spark technique. This soldering ball is then brought to bonding pad 120 on the silicon chip 50 and a combination of compression force and ultrasonic energy are used to create the desired metallurgical bond. Using this "stitch" technique significantly reduces the cross-section of the wire at that point. A loop is created in the wire bonding 80 above the bond that has just been achieved, and the wire bonding 80 is routed to the desired connection on the printed circuit board 70 such as routing strip 82 or bus bar 110. The wire bonding 80 is clamped and the capillary raised, such that the wire bonding 80 will break free at the outer edge of the bond. This process is repeated until all the bonding pads 120 that require electrical connection on the silicon chip 50 are electrically connected to printed circuit board 70.

Following the assembly of the above-described components, cavity 88 and top opening 86 are filled with potting material 90 as represented by the dashed line above top opening 86 and below cavity 88.

The potting material 90 may be a cyanate ester-type resin available from Shin-Etsu Chemical Co., Ltd., such as KMC 184VA and KMC 188VA-4. Other examples of potting materials 90 that may be used with the present invention include epoxies, polyesters, polyimides, cyanoacrylates, ceramic, silicone and urethane. The potting materials 90 may also contain fillers that affect the coefficient of thermal expansion, as well as the strength and flexibility of the potting material 90. The selection of potting materials 90 and fillers will depend on the components used to make the integrated circuit package 30, as will be known to those of skill in the art.

Properties of Typical Potting Resins

|  | Epoxy | Polyester | Silicone | Urethane |
| --- | --- | --- | --- | --- |
| Dielectric constant, D-150 |  |  |  |  |
| 60 Hz | 3.9 | 4.7 | 2.7 | 5.7 |
| 106 Hz | 3.2 | — | 2.7 | 3.4 |
| Dissipation factor, D-150 |  |  |  |  |
| 60 Hz | 0.04 | 0.017 | 0.001 | 0.123 |
| 106 Hz | 0.03 | — | 0.001 | 0.03 |
| Dielectric strength, D-149; V/mil | 450 | 325 | 550 | 400 |
| Volume resistivity, D-257; $\Omega \cdot cm$ | $10^{15}$ | $10^{14}$ | $10^{15}$ | $10^{13}$ |
| Arc resistance, D-495; seconds | 150 | 135 | 120 | 180 |
| Specific gravity, D-792 | 1.15 | 1.2 | 1.05 | 1.0 |
| Water absorption, D-570; % 24 h | 0.15 | 0.3 | 0.12 | 0.4 |
| Heat deflection temperature, D-648; at 264 lb/in², °F. | 380 | 260 | <70 | <70 |
| Tensile strength, D-638; lb/in² | 9000 | 10,000 | 1000 | 2000 |
| Impact strength (Izod), D-256; ft · lb/in | 0.5 | 0.3 | No break | No break |
| Coefficient of thermal expansion, D-969; $10^{-5}/°F.$ | 5.5 | 7.5 | 4.0 | 15 |
| Thermal conductivity, C-177; Btu · in/ (h · ft² · °F.) | 1.7 | 1.7 | 1.5 | 1.5 |
| Linear shrinkage; % | 0.3 | 3.0 | 0.4 | 2.0 |
| Elongation, D-63B; % | 3 | 3 | 175 | 300 |

Although the board-on-chip layout of integrated circuit package 30 as depicted in FIGS. 1 and 2 has been described using centralized bonding pads 120, it should be understood by one skilled in the art that the principles of the present invention are applicable to a silicon chip 50 with bonding pads 120 in alternate layouts such as positioned along the sides of the silicon chip 50.

Also, it should be noted by one skilled in the art that pads 100 and bus bars 110 may be located on a single layer of printed circuit board 70. Generally, a layer of insulated tape or coating may be is placed on the bus bars 110 to provide for electrical isolation. The advantage of a multi-layer printed circuit board 70, however, is the elimination of the need to insulate the bus bars 110. Additionally, the multi-layer printed circuit board 70 provides a greater process margin for wire bonding.

Figure 3:
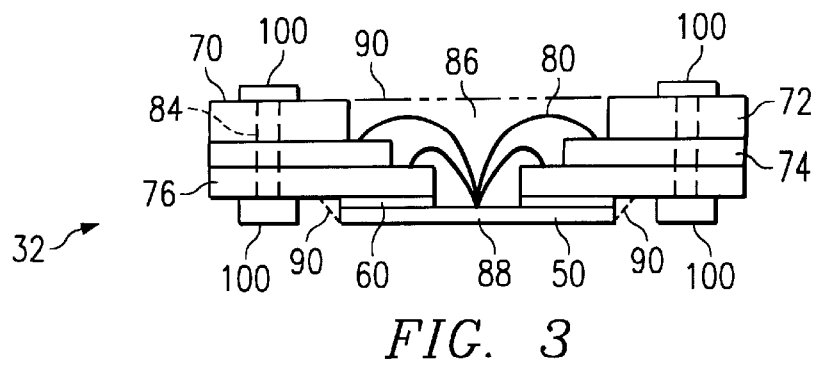
FIG. 3 is a simplified end cross-sectional view of an integrated circuit package of the present invention.

FIG. 3 is a simplified cross-sectional view of an integrated circuit package that is generally designated 32. The integrated circuit package 32 comprises a silicon chip 50 and a printed circuit board 70 which is attached to the silicon chip 50 by an adhesive layer 60. In this embodiment, the printed circuit board 70 consists of three layers, a top layer 72, an intermediate layer 74 and a bottom layer 76. The printed circuit board 70 has a top opening 86. As best seen in FIG. 2, routing strips 82 and bus bars 110 extend into the top opening 86. After assembly, top opening 86 is filled with potting material 90 as represented by the dashed line above top opening 86 and around silicon chip 50. Vias 84 electrically connect pads 100 located on top surface 92 of top layer 72 and bottom surface 94 of bottom layer 78.

FIG. 4 shows a strip 140 of ten units 31 of printed circuit boards 70 before assembly into an integrated circuit package 30. Depicted here is a unit 31 of an integrated circuit board 70 having pads 100. Each unit 31 has an opening 86, pads 100 and a Pin #1 96 located at the bottom right corner of the unit 31. Surrounding the opening 86 are routing strips 82, which serve to electrically connect the printed circuit board 70 to a silicon chip 50 (not depicted). To separate the unit 31 from the other units on strip 140, open areas 33 are depicted. Open areas 33 reduce the amount of substrate material needed to form the strip 140. The open areas 33 also facilitate the removal of each unit 31 from the strip 140.

FIG. 5 shows two alternative positions for Pin # 1 96 by depicting a top view (left) and a bottom view (right) of an assembled integrated circuit package 30. In order to provide a flexible location for Pin #1 96 on a printed circuit board 70, pads 100 are located on the first surface 92 and the second surface 94 of an printed circuit board 70. The connections to either the first or the second surface 92, 94 of the printed circuit board 70 may be made using vias 84 that interconnect the opposing surfaces, or by drilling through the printed circuit board 70 into the layer having routing strips 82. Solder balls 150 may be placed on either the first or the second surface 92, 94 of the printed circuit board 70, or on both surfaces, depending on the design requirements.

As such, one advantage of the Pin #1 96 printed circuit board 70 of the present invention is that it can be used to minimize the distance of circuit routing on a motherboard. This advantage is gained because the designer of motherboards is able to place the connection point on a motherboard for Pin #1 96 on any corner of the printed circuit board 70, as described hereinbelow.

During the assembly process of a printed circuit board 70, the location of Pin #1 96 is both fixed and definite, being located at a specified location relative to the opening 86 of the printed circuit board 70, the wire bonding 80 and the specific wire bonding sequence for the particular silicon chip 50. Once the integrated circuit package 30 has been assembled, however, the location of Pin #1 96 can be to any of eight corners, namely, the four corners of the assembled integrated circuit package 30 with the opening 86 containing the wire bonding 80 and potting material 90 either facing up (away from a motherboard) or down (toward a mother board). As used herein, the terms "top", "bottom", "right" and "left" are used in connection with the description of FIGS. 5 and 6 for illustrative purposes only. In light of the present specification, those of skill in the art will be able to understand that the integrated circuit package 30 of the present invention can be assembled, designed and used in a variety of ways and positions, interchangeably. By placing the solder ball 150 for Pin #1 96 on a pad 100 on a the printed circuit board 70 surface facing either toward or away from the opening 86 of the printed circuit board 70, Pin #1 96 may be connected to a motherboard (not depicted) in any direction.

An example of a flexible Pin #1 96 printed circuit board 70 is depicted in FIG. 6. The flexible Pin #1 printed circuit board 70 is designed with solder balls 150 at the end of a printed circuit board 70. The solder balls 150 may be electrically connected through a via 84 that traverses the printed circuit board 70. The flexible Pin #1 96 printed circuit board 70 permits the user to select the location of Pin #1 96 relative to the motherboard on which the integrated circuit package 30 is placed by a series of 180 degree rotations. The solder ball 150 that connects to Pin #1 96 on the printed circuit board 70 can be positioned in any corner, and facing in either direction relative to the opening 86 of the printed circuit board 70.

For example, if the board is printed and solder balls 150 are located on both surfaces (92 and 94) at the "bottom-right" corner of the printed circuit board 70, the location of the solder balls 150 provides for positioning of the assembled chip on a motherboard (not depicted) in two positions. Those positions being with the opening 86 containing the wire bonding 86 and the potting material 90 facing either away from, or toward, a motherboard. Referring to FIG. 6, rotation of the assembled integrated circuit package 30, for example, by 180 degrees around the axis depicted as z, allows for Pin #1 to be moved to the "top left", again facing with the opening 86 "up" or "down". Rotation around the axis depicted as x, moves the Pin #1 96 location to the "bottom left" positions. Another 180 degree rotation around the z axis, moves the location of Pin #1 to the last required position, that is, the top "right position", again with the possibility of connection with the opening 86 of the printed circuit board 70 in either direction.

Using the present invention, a designer of motherboards or SIMM modules is not restricted to the location of Pin #1 96, but rather, will be able to design the underlying motherboard without concern for the distance between Pin #1 96 and the circuit routing on the motherboard, as Pin #1 96 can be in any of four corners facing toward or away from the motherboard.

One advantage for the flexible positioning of Pin #1 96 is in the design of motherboards with shorter routing strips. For example, a motherboard can be designed that permits attachment of silicon chip integrated circuit packages 30 on both sides of the motherboard, where the distance between the Pin #1 96 of both integrated circuit packages 30 is only the thickness of the motherboard.

Likewise, routing distance could be minimized by placing the integrated circuit packages 30 having a flexible Pin #1 96 printed circuit board 70, side-by-side. One example of this side-by-side arrangement would be to have adjacent integrated circuit packages 30, one integrated circuit package to having its Pin #1 96 on the top right corner, and the Pin #1 96 integrated circuit package 30 immediately to the right of the first integrated circuit package 30, on the top left. Using the present invention, design options are maximized and distances between connections can be minimized, thereby saving resources and improving processing efficiency.

Integrated circuit package 30 may also be interconnected with other integrated circuit packages 30 using solder balls 150. Solder balls 150 replace the leads used to connect conventional integrated circuit packages to, for example, a motherboard. The use of solder balls 150 reduces the overall profile of the integrated circuit package 30 and the integrated circuit module 130.

The solder balls 150 used with the present invention may be attached to the pads 100 using conventional solder reflow systems. For example, a vapor phase solder reflow system may be used, which condenses vapor to surround the integrated circuit package 30 and the printed circuit board 70 with a cloud of steam. A liquid, such as a nonchlorinated (non CFC) fluorocarbon is first heated with enough energy to form a vapor and to sustain a vapor cloud. When the integrated circuit package 30 is then passed through the vapor, the vaporized liquid condenses thereon and gives off the latent heat of vaporization. This energy is then transferred to the integrated circuit package 30. As long as the integrated circuit package 30 remains in the vapor, the vapor continues to give off energy at a repeatable fixed rate and temperature, until the integrated circuit package 30 reaches the temperature of the vapor.

The advantage of using a nonchlorinated fluorocarbon is that it is extremely thermally stable, colorless, odorless and nonflammable. In addition, it has a low toxicity, low surface temperature, low boiling point, and low heat of vaporization. Because the fluid form of the non-chlorinated fluorocarbon is inert, it does not react with fluxes or component materials, nor does it absorb oxygen or other gases that cause reactions during the solder reflow. Most commercially available fluorocarbons used for vapor phase reflow are formulated to vaporize at precisely stable reflow temperatures for different solder materials, as will be known to those skilled in the art.

The vaporization temperature will depend on the solder type being used. A brief list of the non-chlorinated fluorocarbons that are used as vapor fluids is shown below.

Vaporization Temperatures and Solder Types

| Fluid Temperature | Solder Type |
|---|---|
| 56, 80, 97, 101, 102° C. and 155° C. | 100 In |
| | 37 Sn/38 Pb/25 In |
| 165° C. | 70 Sn/18 Pn/12 In |
| | 70 In/30 Pb |
| 174° C. | 60 In/40 Pb |
| 190° C. | 90 In/10 Ag |
| | 50 In/50 Pb |
| | 63 Sn/37 Pb |
| | 70 Sn/30 Pb |
| | 60 Sn/40 Pb |
| 215° C. and 230° C. | 60 Sn/40 In |
| | 60 Sn/40 Pb |
| | 63 Sn/37 Pb |
| | 70 Sn/30 Pb |
| | 62 Sn/36 Pb/2 Ag |
| 240° C. and 253° C. | 75 Pb/25 In |
| | 81 Pb/19 In |
| 260° C. and 265° C. | 96.5 Sn/3.5 Ag |

Alternatively, infrared or radiant heated solder reflow may be used. In such a system each component of the soldering system is directly exposed to radiation from a heating element. Heat from the radiant energy element is absorbed by the different components according to its molecular structure.

Conventional radiant heat systems expose only the outer surfaces of the components to the radiant heat, which may not reach interior areas as efficiently as with vapor saturated heating methods as described above. The present invention, however, is not affected by this typical problem because of the use of solder balls 150 instead of leads. In fact, due to the reduced overall size either method, vapor phase solder reflow or radiant heated solder reflow, may be effectively used with the present invention.

The present invention also solves other problems associated with solder reflow systems. These problems include the creation or failure due to voids, coplanarity, tombstoning, open joints, component cracking, thermal shock and thermal stressing. The present invention solves these problems because it dispenses with the need for electrically connecting soldering leads to the integrated circuit package 30. By using solder balls 150 instead of leads, the problems associated with voids around pad areas or under leads caused by incomplete reflow or poor welding of the soldering surface due to improper flux or badly oxidized surfaces is eliminated. The problems of coplanarity and tombstoning are also reduced or eliminated using the solder balls 150 because surface tension on both sides of the solder balls 150 is equal.

Open joints are usually caused by problems with coplanarity, while cracking may occur when trapped moisture within an integrated circuit package expands as the device is heated for reflow. The increase in internal pressure, causes the integrated circuit package to split open, usually at one of the corners. The splitting of the package causes wire bonding from the lead frame to the silicon chip to break and in some cases the silicon chips have cracked due to the warpage at the top of the package as the temperature differentials between the top and the bottom of the device cause different rates of expansion.

Using the present invention, the only surface temperature differential that occurs is between the solder ball 150 and the printed circuit board 70, which allows either vapor phase solder reflow or radiant heat solder reflow to be available for producing the present invention. The small size of the solder balls 150, and of the integrated circuit package 130 as a whole, allows for any of the reflow systems to be used with the because the temperature differential between the components is almost negligible. Furthermore, by selecting a potting material 90 having a coefficient of thermal expansion similar, or equal to, the coefficient of thermal expansion of the other components of the integrated circuit package 30, heat reflow effects and problems can be minimized.

Furthermore, the method of the present invention takes advantage of the opening 86 at the center of the printed circuit board 70 for potting the wire bonding 80 that connects the silicon chip 50 and the printed circuit board 70 in a single step. By filling the opening 86 with potting material 90, the wire bonding 80 between silicon chip 50 and the printed circuit board 70 are generally protected from the environment and are particularly protected from moisture due to the hermetic nature of the encapsulation.

This means of potting the integrated circuit package 30 of the present invention greatly reduces the overall profile by allowing the non-operative or backside of the silicon chip 50 to be exposed. By hermetically protecting the connections between the silicon chip 50 and the printed circuit board 70 at the top opening 86, there is no need to completely encapsulate the entire assembly.

The problems of coplanarity are eliminated by using solder balls 150 or columns 160 to attach the integrated circuit package 30 to another printed circuit board, such as a mother board, because there are no leads that may bend and there are no deviations from the plane of the motherboard to which the module is being connected.

Additionally, reduced environmental impact is obtained using the method and apparatus of the present invention due to the overall decrease in the size of the integrated circuit package 30.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit package operably positionable in more than one orientation comprising:

a substrate having an opening and first and second surfaces;

at least one bus bar being integral with said substrate and extending into said opening;

a power terminal having first and second ends, said first end disposed on said first surface, said second end disposed on said second surface, said first and second ends being electrically connected with said at least one bus bar;

a plurality of routing strips being integral with said substrate and extending into said opening;

a plurality of pads disposed on said first and second surfaces, at least one of said pads disposed on said first surface being electrically connected with at least one of said routing strips and at least one of said pads disposed on said second surface being electrically connected with at least one of said routing strips;

a chip adhered to said substrate, said chip having at least one bonding pad;

wire bonding electrically connecting said at least one bonding pad to at least one of said routing strips; and potting material filling said opening.

2. The integrated circuit package as recited in claim 1 wherein said power terminal further includes a via extending between said first and second ends.

3. The integrated circuit package as recited in claim 1 further including wire bonding electrically connecting said at least one bus bar to at said least one bonding pad.

4. The integrated circuit package as recited in claim 1 further including at least one solder ball located on said first end of said power terminal.

5. The integrated circuit package as recited in claim 1 further including at least one solder ball located on said second end of said power terminal.

6. The integrated circuit package as recited in claim 1 further including at least one solder ball located on said first end of said power terminal and at least one solder ball located on said second end of said power terminal.

7. The integrated circuit package as recited in claim 1 further including at least one via extending between at least one of said pads disposed on said first surface and at least one of said pads disposed on said second surface.

8. The integrated circuit package as recited in claim 1 wherein said substrate further includes a cavity and wherein said chip is adhered to said substrate in said cavity.

9. An integrated circuit package operably positionable in more than one orientation with respect to a power source, the integrated circuit package comprising:

a substrate having an opening and first and second surfaces;

at least one bus bar being integral with said substrate and extending into said opening;

a power terminal having first and second ends, said first end disposed on said first surface, said second end disposed on said second surface, said first and second ends being electrically connected with said at least one bus bar;

a via extending between said first and second ends;

a plurality of routing strips being integral with said substrate and extending into said opening;

a plurality of pads disposed on said first and second surfaces, at least one of said pads disposed on said first surface being electrically connected with at least one of said routing strips and at least one of said pads disposed on said second surface being electrically connected with at least one of said routing strips;

a chip adhered to said substrate, said chip having at least one bonding pad;

first wire bonding electrically connecting said at least one bonding pad to at least one of said routing strips;

second wire bonding electrically connecting said at least one bonding pad to said at least one bus bar; and potting material filling said opening.

10. The integrated circuit package as recited in claim 9 further including at least one solder ball located on said first end of said power terminal.

11. The integrated circuit package as recited in claim 9 further including at least one solder ball located on said second end of said power terminal.

12. The integrated circuit package as recited in claim 9 further including at least one solder ball located on said first end of said power terminal and at least one solder ball located on said second end of said power terminal.

13. The integrated circuit package as recited in claim 9 further including at least one via extending between at least one of said pads disposed on said first surface and at least one of said pads disposed on said second surface.

14. The integrated circuit package as recited in claim 9 wherein said substrate further includes a cavity and wherein said chip is adhered to said substrate in said cavity.

15. An integrated circuit package operably positionable in more than one orientation produced by a process comprising the steps of:

obtaining a substrate having an opening and first and second surfaces;

extending at least one bus bar within said substrate into said opening;

disposing a power terminal having first and second ends in said substrate, said first end disposed on said first surface, said second end disposed on said second surface, said first and second ends being electrically connected with said at least one bus bar;

extending a plurality of routing strips within said substrate into said opening;

disposing a plurality of pads on said first and second surfaces;

electrically connecting at least one of said pads with at least one of said routing strips;

electrically connecting at least one of said pads disposed on said first surface with at least one of said pads disposed on said second surface with at least one via;

adhering a chip to said substrate, said chip having at least one bonding pad;

electrically connecting said at least one bonding pad to at least one of said routing strips with wire bonding; and filling said opening with a potting material.

16. The process as recited in claim 15 further including extending a via between said first and second ends of said power terminal.

17. The process as recited in claim 15 further comprising the step of attaching at least one solder ball to said first end.

18. The process as recited in claim 15 further comprising the step of attaching at least one solder ball to said second end.

19. The process as recited in claim 15 further comprising the step of attaching at least one solder ball to said first end and attaching at least one solder ball to said second end.

* * * * *